United States Patent [19]

Nakajima et al.

[11] Patent Number: 5,235,552
[45] Date of Patent: Aug. 10, 1993

[54] SEMICONDUCTOR MEMORY DEVICE AND METHOD OF READING DATA THEREFROM

[75] Inventors: Toyokatsu Nakajima; Mitsuru Sugita, both of Hyogo, Japan

[73] Assignee: Mitsubishi Denki Kabushiki Kaisha, Tokyo, Japan

[21] Appl. No.: 836,892

[22] Filed: Feb. 19, 1992

[30] Foreign Application Priority Data

Mar. 7, 1991 [JP] Japan .................................. 3-42062

[51] Int. Cl.$^5$ .............................................. G11C 7/00
[52] U.S. Cl. ........................... 365/230.05; 365/189.01; 365/195; 365/189.05
[58] Field of Search ............... 365/230.05, 195, 189.01, 365/189.05

[56] References Cited

U.S. PATENT DOCUMENTS 4,953,132  8/1990  Katsu et al. ..................... 365/189.05
4,982,366  1/1991  Takemae ............................ 365/195
5,119,333  6/1992  Seo .................................. 365/189.05

Primary Examiner—Eugene R. LaRoche
Assistant Examiner—Andrew Tran
Attorney, Agent, or Firm—Lowe, Price, LeBlanc & Becker

[57] ABSTRACT

Based on address data of memory cells inputted in a first operating cycle of a host system, data is read from a selected memory cell and outputted from a sense amplifier. At this time, a switch is turned on to allow the output data of the sense amplifiers to be stored in a read storage device. The host system does not accept the data stored in the read storage device and outputted from an A-port data input/output terminal then. Next, the switch is turned off based on address data of the read storage device inputted from the host system in a second operating cycle thereof. In the second operating cycle, the host system accepts the data stored in the read storage device and outputted from the A-port data input/output terminal. In this way, data reading from a memory cell is executed in two operating cycles, and a delay due to the memory cell array and one due to a wiring capacitance of signal lines between the semiconductor memory device and host system are distributed to the respective operating cycles.

20 Claims, 11 Drawing Sheets

SEMICONDUCTOR MEMORY DEVICE AND METHOD OF READING DATA THEREFROM

BACKGROUND OF THE INVENTION

1. Field of the Invention

This invention relates to semiconductor memory devices and methods of reading data therefrom. More particularly, the invention relates to a semiconductor memory device having an improved reading system and to a method of reading data therefrom.

2. Description of the Background Art

This invention is applicable to both single port memories and multi-port memories. Disadvantages of the prior art will be described hereinafter with reference mainly to a dual port memory which is one example of multi-port memories.

FIG. 5 is a block diagram showing an example of use modes of the dual port memory. In the drawing, a dual port memory 1 has two input/output ports. One input/output port (hereinafter called "A port") is connected through a system bus 2 to a host system 3. The other port (hereinafter called "B port") of the dual port memory 1 is connected through a system bus 4 to a slave system 5. The host system 3 and slave system 5 may be any type as long as they are designed to process data. These systems are typically designed as multiprocessor systems including CPUs, for example. Thus, the host system 3 has a host CPU 31, ROMs 32 and RAMs 33, while the slave system 5 has a slave CPU 51, ROMs 52 and RAMs 53. The dual port memory 1 includes a built-in memory device. This memory device is separately accessible to the host system 3 and slave system 5.

The dual port memory 1 as described above is often used in data transfer between the host system 3 and slave system 5. Where the host system 3 and slave system 5 operate asynchronously, for example, it is difficult to transfer data directly between the two systems. The respective systems are capable of inputting or output data when necessary by data transfer through the dual port memory 1. This improves system throughput, and allows the two systems 3 and 5 to operate in relation to each other to realize a system configuration of increased scale.

FIG. 6 is a block diagram showing an example of known dual port memories. In the drawing, a memory cell array 10 includes a plurality of word lines and a plurality of bit lines arranged to cross each other, with a memory cell provided at the intersection of each word line and bit line. This memory cell array 10 has a decoder 11a and a sense amplifier 12a for the A port, and a decoder 11b and a sense amplifier 12b for the B port. The decoder 11a receives A-port address data from the host system 3 through an address input terminal 13a, while the decoder 11b receives B-port address data from the slave system 5 through an address input terminal 13b. A tri-state storage device 15a for data writing and a tri-state storage device 16a for data reading are connected in parallel between the sense amplifier 12a and an A-port data input/output terminal 14a. A write enable signal is applied from the host system 3 through an A-port write signal input terminal 17a to a control terminal of the tri-state storage device 15a. The tri-state storage device 15a has an output state controllable in response to this write enable signal. A read enable signal is applied from the host system 3 through an A-port read signal input terminal 18a to a control terminal of the tri-state storage device 16a. The tri-state storage device 16a has an output state controllable in response to the read enable signal. For the B port, similarly, a tri-state storage device 15b for data writing and a tri-state storage device 16b for data reading are connected in parallel between the sense amplifier 12b and a B-port data input/output terminal 14b. A write enable signal is applied from the slave system 5 through a B-port write signal input terminal 17b to a control terminal of the tri-state storage device 15b. The tri-state storage device 15b has an output state controllable in response to this write enable signal. A read enable signal is applied from the slave system 5 through a B-port read signal input terminal 18b to a control terminal of the tri-state storage device 16b. The tri-state storage device 16b has an output state controllable based on the read enable signal.

FIG. 7 is a view showing an input/output structure for one memory cell in the memory cell array 10 shown in FIG. 6. The memory cell array 10 has a plurality of memory cells 101 arranged in rows and columns to form a matrix. As shown in FIG. 7, the memory cell array 10 has two word lines 103a and 103b for each row of memory cells 101, and two bit lines 104a and 104b for each column. Further, two transfer gate transistors 102a and 102b are provided for each memory cell 101. The word line 103a, bit line 104a and transfer gate transistor 102a are associated with the A port. The word line 103b, bit line 104b and transfer gate transistor 102b are associated with the B port. In this way, the dual port memory shown in FIGS. 6 and 7 has completely independent access systems for the A port and the B port. Consequently, the host system 3 and slave system 5 are allowed to access the memory cell array 10 simultaneously.

With the dual port memory 1 having the above construction, the tri-state storage device 15a is activated when a write request is received from the host system 3, whereby writing data is applied from the host system 3 to the sense amplifier 12a. When a write request is received from the slave system 5, the tri-state storage device 15b is activated whereby writing data is applied from the slave system 5 to the sense amplifier 12b. When a read request is received from the host system 3, the tri-state storage device 16a is activated whereby data read from a selected memory cell is outputted to the host system 3 through the A-port data input/output terminal 14a. When a read request is received from the slave system 5, the tri-state storage device 16b is activated whereby a data read from a selected memory cell is outputted to the slave system 5 through the B-port data input/output terminal 14b.

Generally, it is necessary for the dual port memory to have two pairs of bit lines and word lines for each memory cell as shown in FIG. 7. As a result, the dual port memory has a large wiring capacitance and requires an access time nearly twice that of an ordinary ROM or RAM. It has therefore been conventional practice that, when configuring a system using a dual port memory, the ready function (standby function) of the CPU is used to realize a maximum speed from the system.

FIG. 8 shows a multiprocessor system using CPUs having the ready function. In the drawing, the host system 3 and slave system 5 include address decoders 34 and 54, respectively. The address decoder 34 decodes address data outputted to the system bus 2, and outputs a ready signal when the dual port memory 1 is accessed. Similarly, the address decoder 54 decodes address data outputted to the system bus 4, and outputs a ready signal when the dual port memory 1 is accessed. The ready signal outputted from the address decoder 34 is applied to a ready terminal (RDY terminal) of the host CPU 31, while the ready signal outputted from the address decoder 54 is applied to a ready terminal (RDY terminal) of the slave CPU 51. The host CPU 31 and slave CPU 51, when the ready signals are received from the address decoders 34 and 54, respectively, wait for a predetermined time before making access to the dual port memory 1.

FIG. 9 is a time chart illustrating operations of the multiprocessor systems shown in FIGS. 5 and 8. In FIGS. 9, (1) and (2) show the operation of the multiprocessor system shown in FIG. 8, while (3) and (4) show the operation of the multiprocessor system shown in FIG. 5.

First, the operation of the multiprocessor system shown in FIG. 8 will be described with reference to FIGS. 9 (1) and (2). FIG. 9 (1) shows cycles of a clock signal for operating the CPU 31 (or CPU 51). FIG. 9 (2) shows operating timing of the CPU 31 (or 51) for executing processes a-h. As shown in FIGS. 9 (1) and (2), the CPU 31 (or 51) operates in synchronism with the operating clock signal. For example, process for reading the ROMs 32 (or 52) and fetching a command is carried out in the first cycle of the operating clock signal. Process b for writing into the RAMs 33 (or 53) in accordance with the command fetched in the process a is carried out in the second cycle of the operating clock signal. What should be noted here is the operating timing for process f. Process f is a process for reading data from the dual port memory 1 in response to a command fetched in process e. As noted hereinbefore, the dual port memory 1 has a disadvantage of slow access speed since two word lines and two bit lines are provided for each memory cell. Consequently, process f for reading data from the dual port memory 1 requires a longer execution time than the other processes illustrated. In view of this drawback, the address decoder 34 (or 54) applies the ready signal to the CPU 31 (or 51) upon start of process f by the CPU 31 (or 51). This causes the CPU 31 (or 51) to wait for a predetermined time (a half cycle of the operating clock signal in FIG. 9 (2)) until completion of process f. As a result, the CPU 31 (or 51) is given a sufficient time for making a read access to the CPU 31 (or 51), thereby to read correct data from the dual port memory 1. Upon completion of process f, the CPU 31 (or 51) is freed from the standby and returns to the normal operating state.

The operation of the multiprocessor system shown in FIG. 5 will be described next with reference to FIGS. 9 (3) and (4). FIG. 9 (3) shows cycles of a clock signal for operating the CPU 31 (or CPU 51). FIG. 9 (4) shows operating timing of the CPU 31 (or 51) for executing processes a-h as in FIG. 9 (2). The CPU 31 (or 51) in the multiprocessor system shown in FIG. 5 does not possess the ready function of its counterpart in the multiprocessor system shown in FIG. 8. It is therefore impossible to prolong the execution time for process f alone for reading data from the dual port memory 1. In the multiprocessor system shown in FIG. 5, the time needed to execute process f is secured by means of the operating clock signal having cycles twice as long as those of the clock signal used in the multiprocessor system shown in FIG. 8. As a result, the time consumed in executing the processes other than process f doubles the time required by the multiprocessor system shown in FIG. 5.

As noted above, the execution time of each process is extended without avail in the multiprocessor system of FIG. 5 using the CPUs not having the ready function. Thus, the operating speed of the CPUs is not used to the full extent.

As described above, it is an effective measure to give CPUs the ready function in order to make full use of the operating speed of the CPUs. However, some of the CPUs used in one-chip microcomputers and the CPUs intended for special purposes are destitute of the ready function. Use of such CPUs requires a reduction in the frequency of the clock signal for operating the system, which poses the problem of reducing the operating speed performance of the entire system. This problem occurs with a single port memory as well as a multi-port memory having a plurality of ports. Where, for example, a single system uses a plurality of memories having different operating speeds, the above problem occurs between a memory of slow operating speed and the system.

In one way of constructing a multiprocessor system, a single processor system (e.g. a host system) is completed first and then a slave system designed to use part of the data in the host system is added to complete the whole multiprocessor system. In this case, as shown in FIG. 10, the slave system may be added without altering the program of the host system if addresses of the dual port memory are superposed on an address space 320 of memories inside the host system which are controlled by the host CPU 31 because this will not enlarge the address space of the memories that needs the control on the host system side.

However, it has been conventionally impossible to arrange the address regions of the dual port memory in a way to share the address space with the internal memories of the host system. The reason is that, when the host CPU 31 attempts to read data from the dual port memory, an internal memory region having the same address would also be designated, resulting in a collision of data.

Therefore, when the slave system is added to the completed host system, it is necessary to arrange the address regions of the dual port memory in a position outside of the address space of the internal memories of the host system. This requires a program for the host system to be designed all over again.

This problem will be described more specifically taking automobile engine control for example. Automobile engine control requires data of an engine control system to control the transmission in an automatic car. In a manual shift car such as a sports car or the like, however, transmission control may not be carried out by a microcomputer. That is, some of the automobiles having the same engine require transmission control by a microcomputer and others do not. When designing a microcomputer system for engine control which may or may not require a microcomputer for transmission control, different programs must be prepared for the case involving data transfer between the host system and dual port memory and for the case involving no such data transfer. This is an instance of doubled, irksome trouble, and tends to create a problem of management as well. Thus, the address regions of the dual port memory should be arranged on the address space in the system that uses the dual port memory, if possible.

In the prior art, as described above, where a system having a CPU without the ready function has access to a low-speed memory, the operating speed of the system must correspond the access speed of the memory. This results in lowering the operating speed performance of the system.

Where a plurality of systems share one multi-port memory, with the address regions of the multi-port memory superposed on the address space of the internal memories of one system, collision occurs between the data from the internal memories of the system and the data from the multi-port memory.

SUMMARY OF THE INVENTION

An object of this invention, therefore, is to provide a semiconductor memory device which solves the problems noted above and allows a system to make smooth access and a method of reading data from such device.

Another object of this invention is to provide a semiconductor memory device and a method of reading data therefrom, which make full use of the operating speed performance of the system that uses the memory device and the reading method.

A further object of this invention is to provide a semiconductor memory device which allows address regions thereof to be superposed on an address space of internal memories of the system that uses the memory device, without causing a collision between data read from the semiconductor memory device and data read from the internal memories of the system.

A semiconductor memory device according to this invention includes a memory cell array, a selecting device, a storage device, an address identifying device and a transmission control device. The memory cell array includes a plurality of memory cells. The selecting device selects one of the memory cells in the memory cell array in response to address data applied from an external system. The storage device has an address assigned exclusively thereto, and temporarily stores and then outputs to the external system data read from the memory cell selected by the selecting device. The address identifying device identifies the address data applied from the external system as a memory cell address or the address of the storage device. The transmission control device controls data transmission to and from the storage device in response to output of the address identifying device.

Another semiconductor memory device according to this invention includes a memory cell array, a selecting device, a storage device, an address identifying device, an address space detecting device and a transmission control device. The memory cell array includes a plurality of memory cells and has at least part of an address space thereof overlapping internal memories of an external system. The selecting device selects one of the memory cells in the memory cell array based on address data applied from the external system. The storage device has an address assigned exclusively thereto, and temporarily stores and then outputs to the external system data read from the memory cell selected by the selecting device. The address identifying device identifies the address data received from the system as a memory cell address or the address of the storage device. The address space detecting device is operable when the address data applied from the external system shows the address of one of the memory cells, for detecting this address existing within the address space overlapping the internal memories of the external system. The transmission control device controls data transmission to and from the storage device in response to outputs of the address identifying device and address space detecting device.

A data reading method according to this invention is used in reading data from a semiconductor memory device including a memory cell array including a plurality of memory cells, a selecting device for selecting one of the memory cells in the memory cell array based on address data applied from an external system, and a storage device for temporarily storing and then outputting to the external system data read from the memory cell selected by the selecting device. This method has the following operating steps. Data is read from the selected memory cell and stored in the storage device in a first operating cycle of the external system. Next, the data is read from the storage device in a second operating cycle of the external system following the first operating cycle.

In the first-mentioned semiconductor memory device according to this invention, the data read from the memory cell selected by the selecting device is output through the storage device to the external system. The storage device has an address assigned exclusively thereto. The address identifying device identifies the address data applied from the external system as a memory cell address or the address of the storage device. In response to output of the address identifying device, the transmission control device controls data transmission to and from the storage device. Thus, the external system may be capable of reading data from the semiconductor memory device in two separate steps; one for storing the data read from the selected memory cell in the storage device, and the other for reading the data stored in the storage device. Since the wiring capacitance between the memory cell array and storage device is small, data transmission from the memory cells to the storage device is faster than direct data reading from the memory cells to the external system. The storage device is operable at high speed, which allows data to be read therefrom at a very high speed. Consequently, the external system is allowed to include, in normal operating cycles, the first operation to store the data read from the selected memory cell in the storage device and the second operation to read the data stored in the storage device. This allows data reading from the semiconductor memory device to be carried out without reducing the frequency of the operating clock signal of the external system.

In the second-mentioned semiconductor memory device according to this invention, the address space detecting device is operable when the address data applied from the external system shows the address of one of the memory cells, for detecting this address existing within the address space overlapping the internal memories of the external system. The transmission control device controls data transmission to and from the storage device in response not only to output of the address identifying device but also to output of address space detecting device. Consequently, this semiconductor memory device, as does the foregoing semiconductor memory device, allows data reading from a memory cell to be separately carried out in the first operation to store the data read from the selected memory cell in the storage device and the second operation to read the data stored in the storage device. This allows data reading from the semiconductor memory device to be carried out without reducing the frequency of the operating clock signal of the external system. The data stored in the storage device may be outputted to the external system in the second operation instead of the first operation. Then a collision of data is avoided even when an internal memory of the external system and a memory cell in the memory cell array are designated at the same time.

In the method of reading data from a semiconductor memory device according to this invention mentioned last, data reading from a memory cell is carried out in two successive operating cycles of the external system. In the first operating cycle, data is read from a selected memory cell and stored in the storage device. In the second operating cycle following the first operating cycle, the data stored in the storage device is read therefrom. By performing data reading from a memory cell in two successive operating cycles as above, processing time of each operating cycle is shortened to necessitate no reduction in the frequency of the operating clock signal in the external system.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
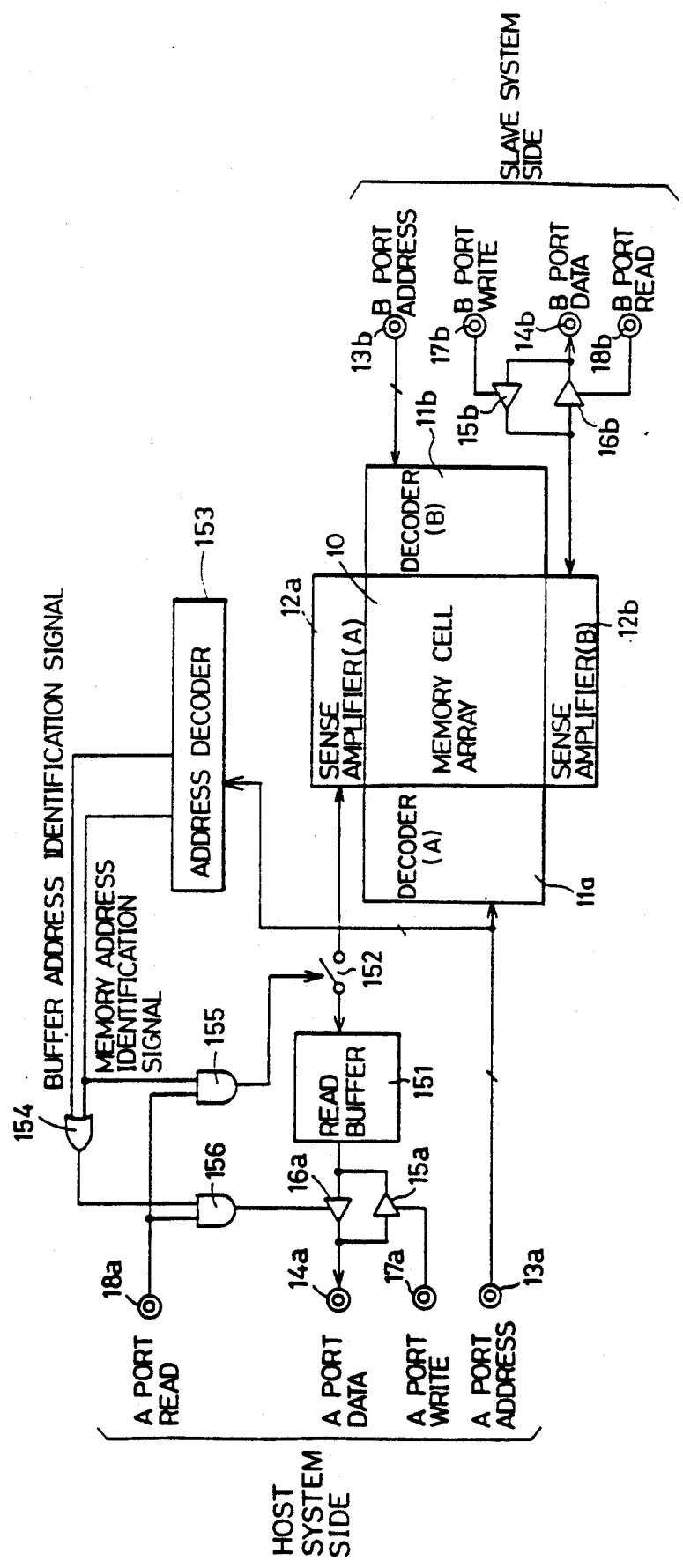
FIG. 1 is a block diagram showing an arrangement according to an embodiment of this invention.

FIG. 1 is a block diagram showing an arrangement of a semiconductor memory device according to one embodiment of this invention. The semiconductor memory device shown in FIG. 1 is constructed as a dual port memory as is the semiconductor memory device shown in FIG. 6.

Figure 6:
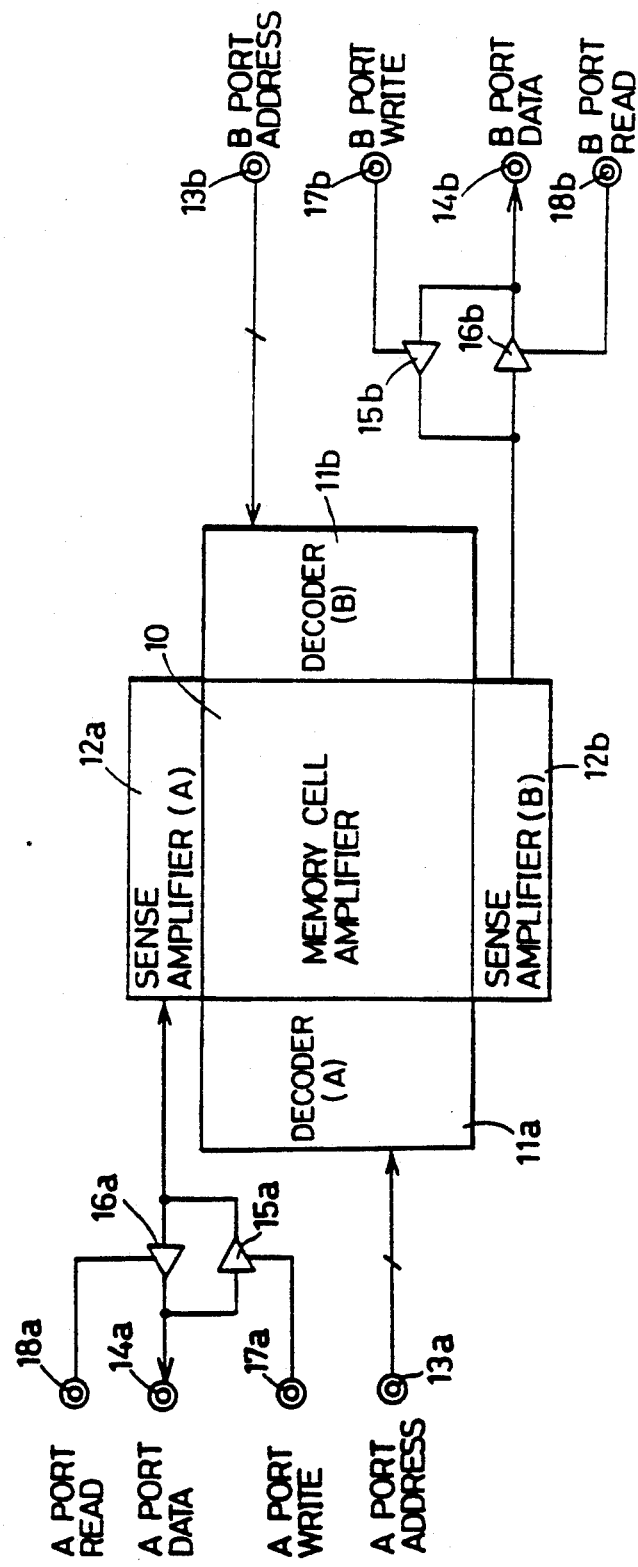
FIG. 6 is a block diagram showing an example of conventional dual port memories.
Figure 7:
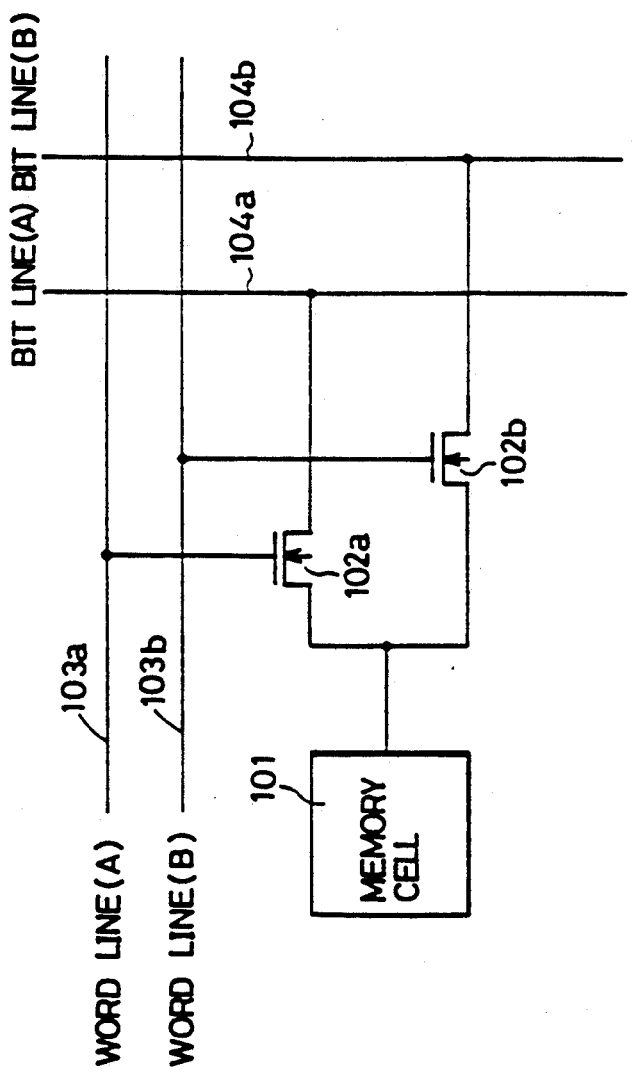
FIG. 7 is a circuit diagram showing a part of an internal arrangement of a memory cell array in the dual port memory shown in FIG. 6.
Figure 8:
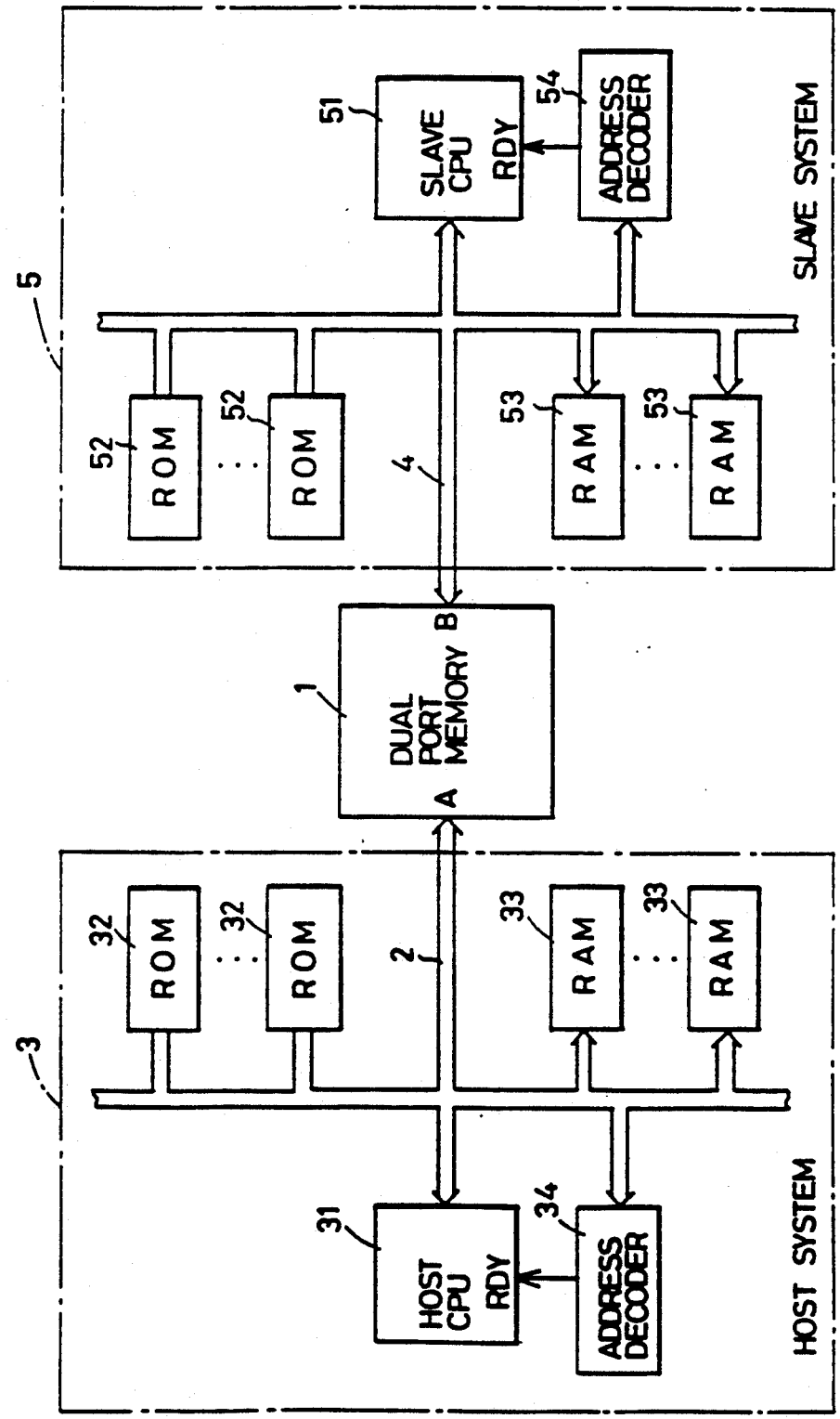
FIG. 8 is a block diagram showing a conventional multiprocessor system using CPUs having a ready function.

The dual port memory shown in FIG. 1 is similar in construction to the known dual port memory shown in FIG. 6 except the aspects described hereunder. Like reference numerals will be used to identify like elements, and their description will be omitted where appropriate.

The semiconductor memory device shown in FIG. 1 includes, besides the components of the conventional semiconductor memory device shown in FIG. 6, a read storage device 151, a switch 152, an address decoder 153, an OR gate 154 and AND gates 155 and 156. The switch 152 is disposed between the sense amplifier 12a and an input of the read storage device 151. The read storage device 151 has an output connected to the input of the tri-state storage device 16a. The address decoder 153 decodes address data of the A system inputted thereto from the address input terminal 13a, and outputs two address identification signals, i.e. a memory address identification signal d1 and a storage device address identification signal d2. The memory address identification signal d1 attains H level when the address data inputted from the A system shows the address of a memory cell in the memory cell array 10. The storage device address identification signal d2 attains H level when the address data inputted from the A system shows an address assigned to the read storage device 151. The memory address identification signal d1 and storage device address identification signal d2 outputted from the address decoder 153 are applied to the OR gate 154. Each of the AND gates 155 and 156 receives, at one input thereof, the read enable signal of the host system inputted through the A-port read signal input terminal 18a. The AND gate 155 receives, at the other input thereof, the memory address identification signal d1 from the address decoder 153. The AND gate 156 receives, at the other input thereof, output of the OR gate 154. Output of the AND gate 155 is applied to the switch 152 as an open/close control signal. Output of the AND gate 156 is applied to the control terminal of the tri-state storage device 16a.

Figure 2:
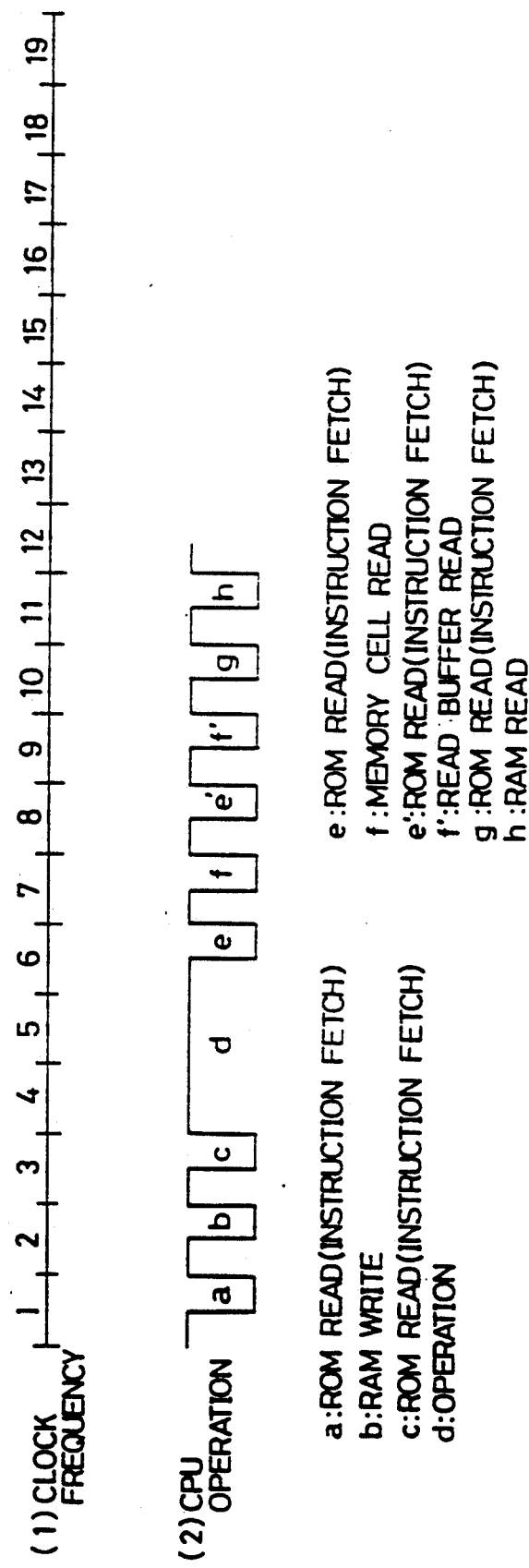
FIG. 2 is a time chart illustrating an operation of a host system in accessing the semiconductor memory device shown in FIG. 1.

FIG. 2 is a time chart illustrating an operation of the host system connected to the semiconductor memory device shown in FIG. 1. FIG. 2 (1) shows cycles of a clock signal for operating a CPU in the host system. FIG. 2(2) shows operating timing of the CPU in the host system. Operations of the embodiment shown in FIG. 1 will be described hereinafter with reference to FIG. 2.

The host system carries out processes a-d and then process e shown in FIG. 2 (2). In the process e, a command is read and fetched from a ROM (that stores programs) in the host system. The command fetched is a command for reading data from one of the memory cells in the memory cell array 10. Based on the command fetched in the process e, the host system reads data from the memory cell in process f. At this time, the host system applies address data of the memory cell through the system bus to the address input terminal 13a of the semiconductor memory device shown in FIG. 1, and the read enable signal at H level to the A-port read signal input terminal 18a. Since the address data inputted from the host system designates one of the memory cells in the memory cell array 10, the address decoder 153 activates the memory address identification signal d1 to H level. The memory address identification signal d1 at H level is applied to the other input of the AND gate 155, and through the OR gate 154 to the other input of the AND gate 156. At this time, the read enable signal at H level is applied to the one inputs of the AND gates 155 and 156. Consequently, the outputs of the AND gates 155 and 156 attain H level. The switch 152 is turned on by the H level output of the AND gate 155, to connect the sense amplifier 12a and the input of the read storage device 151. The H level output of the AND gate 156 is applied to the control terminal of the tri-state storage device 16a to activate the latter. As a result, the tri-state storage device 16a enters through state to transmit output of the read storage device 151 to the A-port data input/output terminal 14a.

On the other hand, the address data inputted from the address input terminal 13a is applied to the decoder 11a for selecting one of the memory cells in the memory cell array 10. A data is read from the selected memory cell and outputted after being amplified by the sense amplifier 12a. Output of the sense amplifier 12a is applied through the switch 152 to the read storage device 151 for storage therein. Since the tri-state storage device 16a is in through state at this time, output of the read storage device 151 is transmitted through the A-port data input/output terminal 14a to the host system. At this time, however, the host system does not accept the data inputted from the dual port memory. The reason is that the read storage device 151 is in the process of replacing a previously stored data with the data newly read from the memory cell, and is highly likely to output an undefined data. Thus, there is no possibility of undefined data being accepted by the host system.

Next, the host system carries out process e' shown in FIG. 2 (2) to read and fetch a new command from the ROM. The command fetched this time is a command to read data from the read storage device 151 in the semiconductor memory device shown in FIG. 1. Based on the command fetched in process e', the host system reads data from the read storage device 151 in process f'. In process f', the host system first outputs the address data for the read storage device 151 through the system bus to the address input terminal 13a. The address data for the read storage device 151 inputted through the address input terminal 13a is decoded by the address decoder 153, whereby the address decoder 153 outputs the storage device address identification signal d2 at H level. At this time, the memory address identification signal d1 attains L level. Since the memory address identification signal d1 attains L level, the output of the AND gate 155 attains L level. Consequently, the switch 152 is turned off, thereby electrically disconnecting the sense amplifier 12a and read storage device 151. This is effective to avoid an undesirable renewal of the data stored in the read storage device 151 due to the output of the sense amplifier 12a when the data is read from the read storage device 151. On the other hand, the output of the OR gate 154 maintains H level since the storage device address identification signal d2 is at H level. Thus, the output of the AND gate 156 maintains H level, whereby the tri-state storage device 16a maintains the through state. As a result, the data stored in the read storage device 151 passes through the tri-state storage device 16a to be outputted from the A-port data input/output terminal 14a to the host system. At this time, the host system accepts the data read and outputted from the semiconductor memory device shown in FIG. 1. Subsequently, the host system terminates process f' shown in FIG. 2 (2).

With the semiconductor memory device shown in FIG. 1, as described above, data reading from the memory cells by the host system is carried out in two stages. In the first stage, one memory cell in the memory cell array 10 is selected and the data read therefrom is stored in the read storage device 151. The host system does not read the data from the read storage device 151 at this time. In the second stage, the host system reads and accepts the data from the read storage device 151.

There are two causes for the delays occurring when the host system reads data from the memory cells in the memory cell array 10. One of these causes is attributable to the structure of the semiconductor memory device per se. The greatest of the delays due to the structure of the semiconductor memory device is one relating to the wiring capacitance of the memory cell array 10. Particularly in a dual port memory as shown in FIG. 1, which includes two word lines and two bit lines provided for each memory cell, the wiring capacitance is larger and the delay longer than in other semiconductor memory devices. The second cause is attributable to the wiring capacitance of the signal lines connecting the semiconductor memory device and host system.

Figure 9:
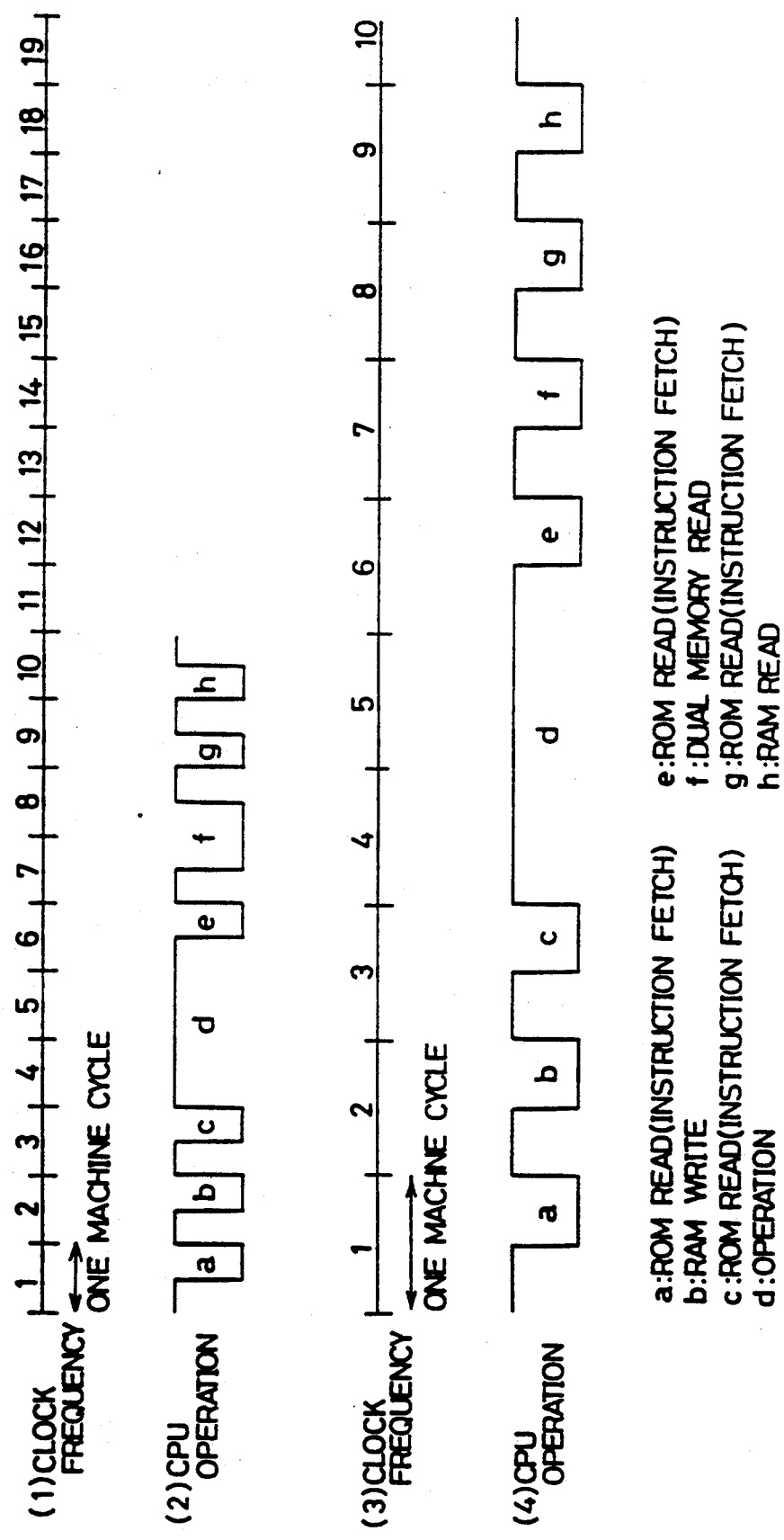
FIG. 9 is a timing chart illustrating operations of the CPUs in the conventional multiprocessor systems shown in FIGS. 5 and 8.
Figure 10:
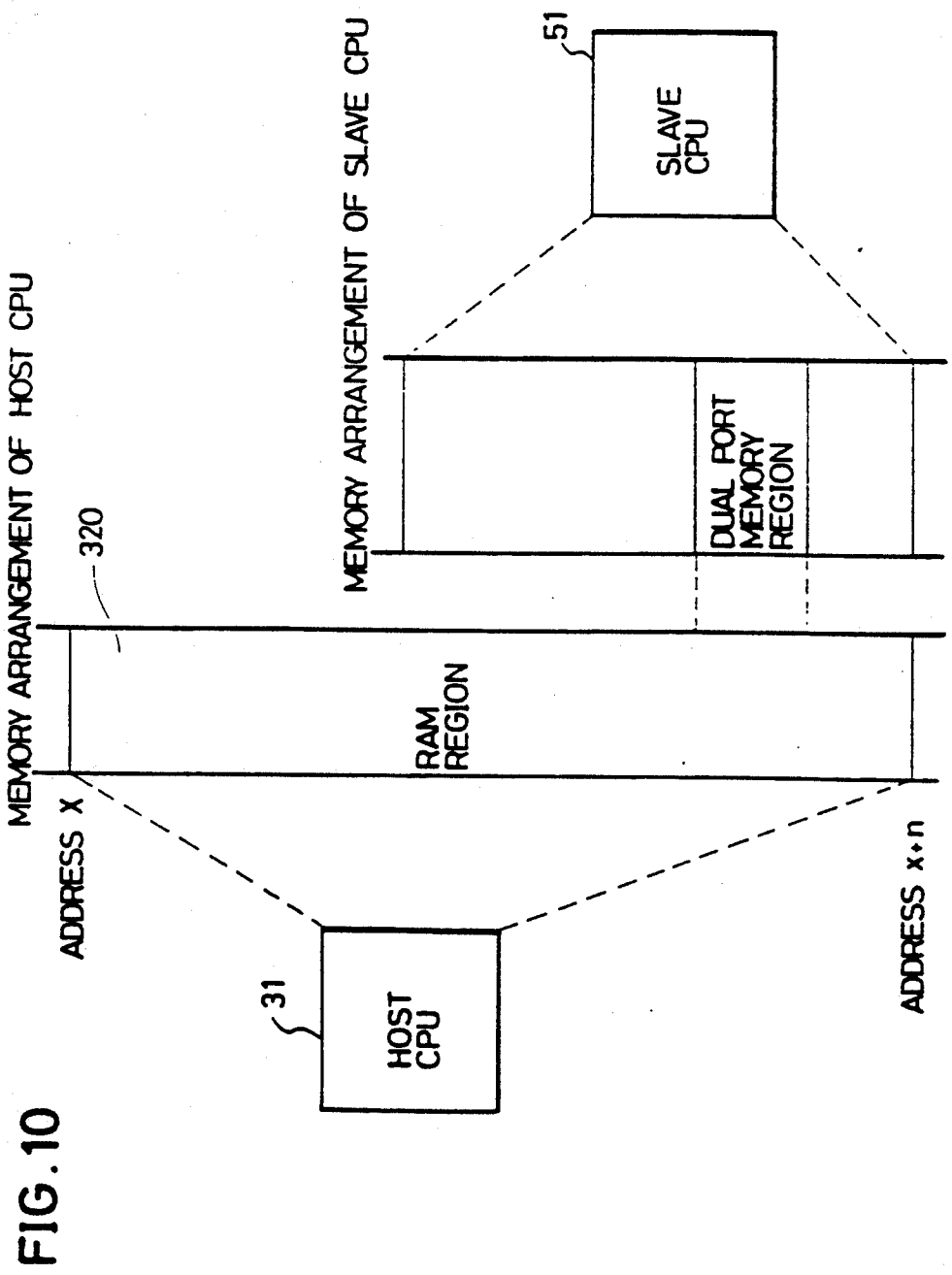
FIG. 10 is a view showing a positional relationship between memory regions of a host CPU and dual port memory regions.
Figure 11:
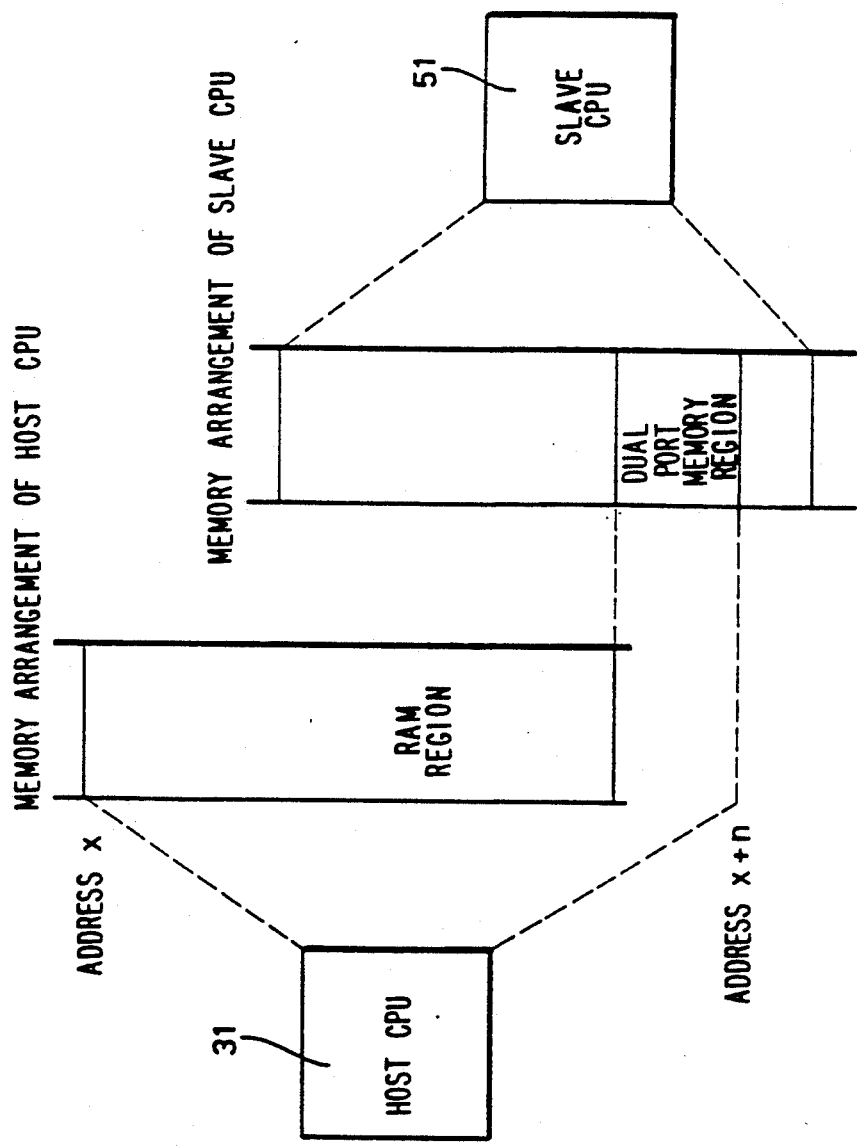
FIG. 11 is a view showing another positional relationship between memory regions of the host CPU and dual port memory regions.

There is little difference between delay time due to the first cause and delay time due to the second cause. Assuming for simplicity that a delay time of 50 ms occurs from both the first and second causes, a delay of 50 ms + 50 ms = 100 ms occurs when the host system reads data from a memory cell in the memory cell array 10. It is difficult for such an accumulated long delay time to be absorbed into one operating cycle of the CPU in the host system that operates at high speed. Therefore, as shown in FIGS. 9 (3) and (4), the frequency of the system operating clock signal has been reduced in the prior art. As distinct from the prior art, the embodiment shown in FIG. 1 attempts to disperse the delay time by dividing the data reading from a memory cell into two stages as noted hereinbefore. That is, process f in FIG. 2 (2) absorbs the delay due to the first cause (attributable mainly to the wiring capacitance of the memory cell array 10). The reason is that the signal line between the sense amplifier 12a and read storage device 151 has a very short wiring length which hardly produces a delay in data transmission. On the other hand, process f' shown in FIG. 2 (2) absorbs the delay due to the wiring capacitance of the signal lines connecting the semiconductor memory device and host system. The reason is that the read storage device 151 is simply a register having little internal wiring capacitance and itself operable at high speed. In this way, the delay due to the internal wiring of the memory cell array 10 and the delay due to the wiring capacitance of the signal lines between the semiconductor memory device and host system are distributed to the two processes f and f', thereby to reduce the delay time to be absorbed by one operating cycle of the host system. Thus, the host system is able to absorb the delay occurring when the host system accesses the semiconductor memory device in a reading operation, without reducing the frequency of the operating clock signal. As a result, the operating speed performance of the system may be utilized to the full extent in making access to the semiconductor memory device even if this memory device has a slow operating speed.

Figure 3:
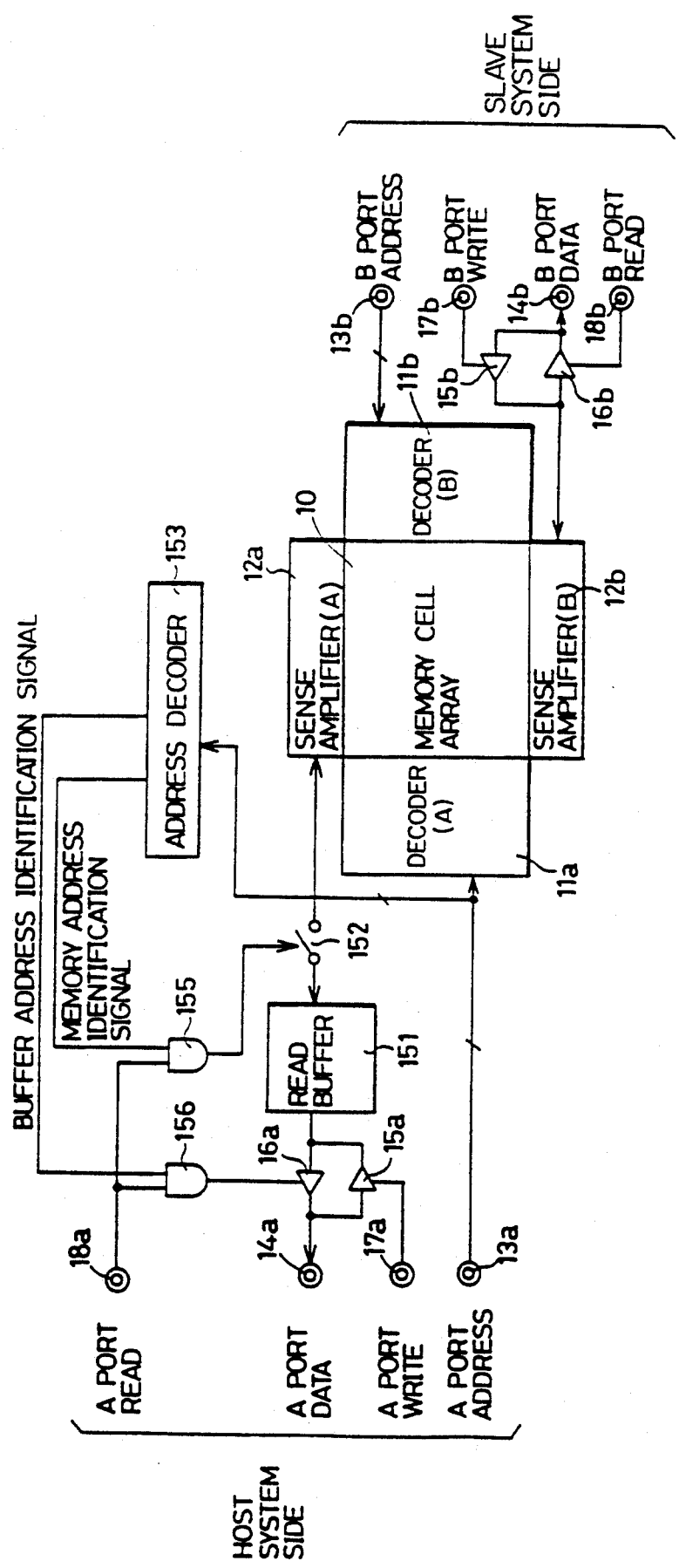
FIG. 3 is a block diagram showing an arrangement according to another embodiment of this invention.

FIG. 3 is a block diagram showing another embodiment of this invention. This embodiment is the same as the embodiment shown in FIG. 1 except the following aspect, and like reference numerals will be used to identify like elements without repeating their description. The embodiment shown in FIG. 3 does not include the OR gate 154 in the embodiment shown in FIG. 1. Consequently, the other input of the AND gate 155 receives the memory address identification signal d1 from the address decoder 153, while the other input of the AND gate 156 receives the storage device address identification signal d2.

The way in which the embodiment shown in FIG. 3 operates will be described next. Upon receipt from the host system of address data of one of the memory cells in the memory cell array 10, the address decoder 153 sets the memory address identification signal d1 to H level and the storage device address identification signal d2 to L level. As a result, the output of the AND gate 155 attains H level to turn on the switch 152. Thus, the data read from the selected memory cell is applied through the switch 152 to the read storage device 151. The output of the AND gate 156 attains L level, thereby placing the tri-state storage device 16a in high-impedance state. As a result, the output of the read storage device 151 is prohibited from passing through the tri-state storage device 16a. Next, when the address data of the read storage device 151 is inputted from the host system, the address decoder 153 changes the memory address identification signal d1 to L level and the storage device address identification signal d2 to H level. This changes the output of the AND gate 155 to L level and the output of the AND gate 156 to H level. Consequently, the switch 152 is turned off to inhibit data input from the sense amplifier 12a to the read storage device 151. The tri-state storage device 16a enters the through state whereby the output of the read storage device 151 is outputted to the host system through the tri-state storage device 16 and A-port data input/output terminal 14a.

In the embodiment shown in FIG. 3, as described above and as in the embodiment shown in FIG. 1, data transfer from a selected memory cell to the host system is carried out in two separate stages. Thus, the delay time occurring with an access for reading is splitted, eliminating the necessity to reduce the operating clock frequency of the host system. As a result, the host system may be operated at high speed even if the semiconductor memory device has a slow operating speed. Further, in the embodiment shown in FIG. 3, the data stored in the read storage device 151 is prohibited from being outputted to the host system when address data of a memory cell is transmitted from the host system. This eliminates the possibility of a collision between the data read from the memory cell array 10 and the data read from the internal memories of the host system, even if the address regions of the memory cell array 10 are superposed on the address space of the internal memories of the host system. This is because an access to an internal memory of the host system for reading data therefrom is completed before the host system outputs the address data of the read storage device 151.

Figure 4:
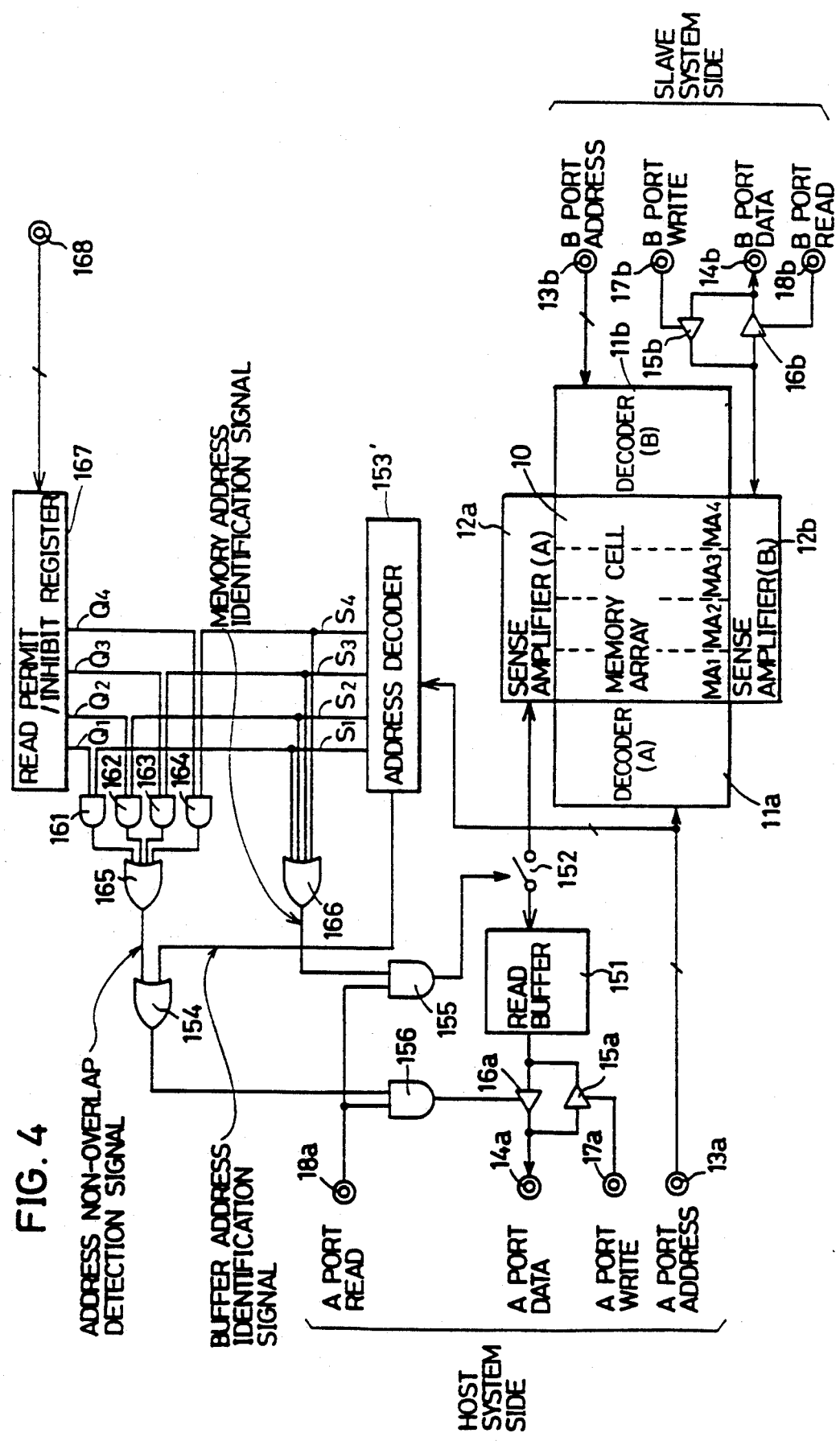
FIG. 4 is a block diagram showing an arrangement according to a further embodiment of this invention.
Figure 5:
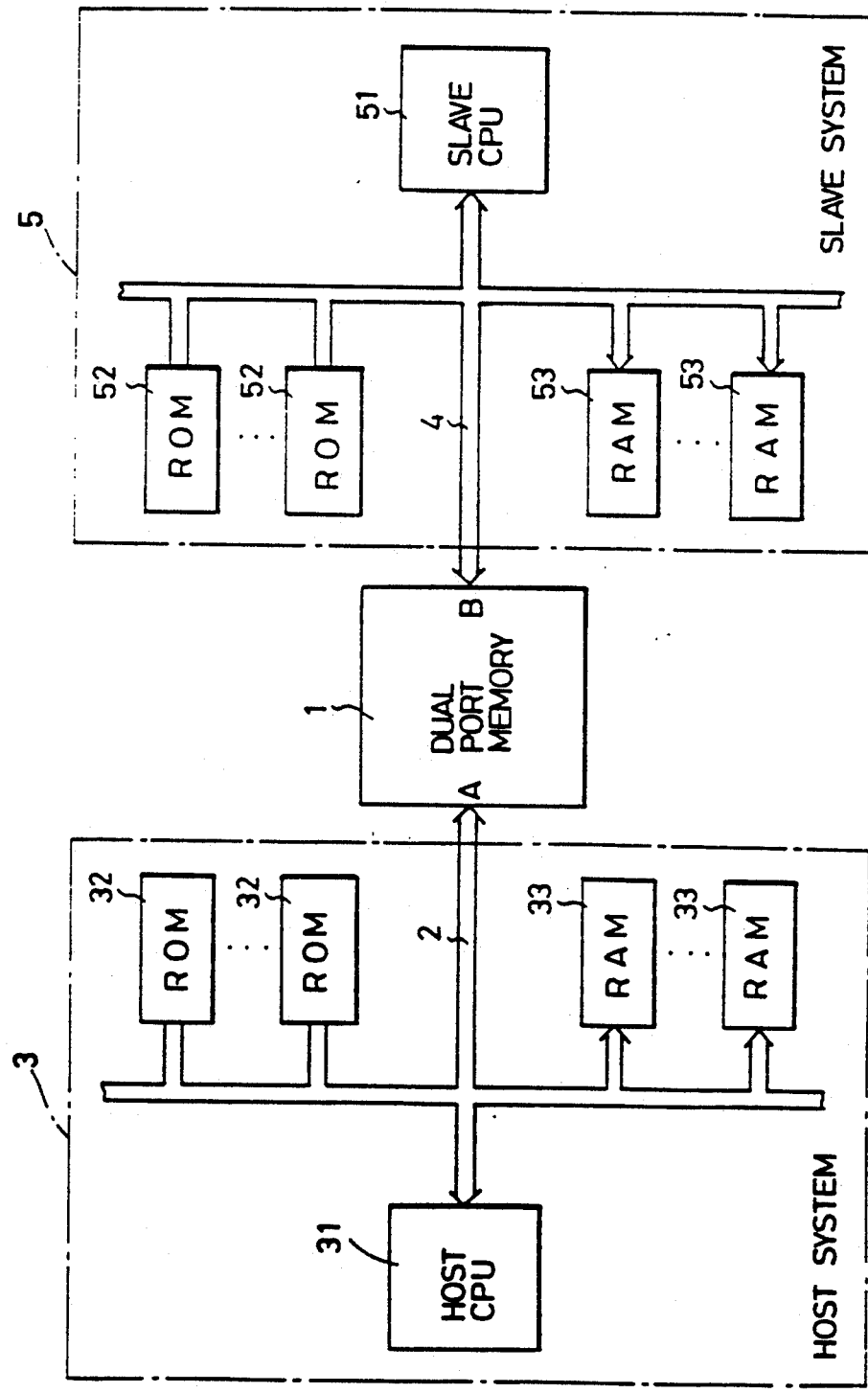
FIG. 5 is a block diagram showing an arrangement according to a use mode of a dual port memory.

FIG. 4 is a block diagram showing a further embodiment of this invention. The embodiment shown in FIG. 4 also is the same as the embodiment shown in FIG. 1 except the following aspects, and like reference numerals will be used to identify like elements without repeating their description.

In FIG. 4, the memory cell array 10 is divided into a plurality of sub-arrays on the address space. In the embodiment shown in FIG. 4, the memory cell array 10 is divided into four sub-arrays MA1-MA4, for example. An address decoder 153' decodes address data received from the host system, and outputs sub-array address identification signals S1-S4 and a storage device address identification signal d2. Specifically, when address data of a memory cell is received from the host system, the address decoder 153' sets one of the sub-array address identification signals MA1-MA4 to H level, which corresponds to the sub-array that includes the memory cell selected by the address data. Further, the address decoder 153' sets the storage device address identification signal d2 to H level when the address data of the read storage device 151 is received from the host system. The sub-array address identification signals S1-S4 are applied to an OR gate 166. The OR gate 166 outputs an H-level signal when one of the sub-array address identification signals S1-S2 is in H level. Thus, the output signal of the OR gate 166 is equivalent to the memory address identification signal d1 outputted from the address decoder 153 shown in FIG. 1. The memory address identification signal d1 outputted from the OR gate 166 is applied to the other input of the AND gate 155.

The sub-array address identification signals S1, S2, S3 and S4 outputted from the address decoder 153' are applied to one inputs of AND gates 161, 162, 163 and 164, respectively. The other inputs of the AND gates 161, 162, 163 and 164 receive output signals Q1, Q2, Q3 and Q4 of a read permit/inhibit register 167. The read permit/inhibit register 167 stores 4-bit read permit/inhibit information inputted through a read permit/inhibit information input terminal 168. The respective bits of the read permit/inhibit information correspond to the sub-arrays MA1-MA4 of the memory cell array 10. The read permit/inhibit register 167 is formed, for example, of four flip-flops to enable storage of the 4-bit read permit/inhibit information. Output signals of these four flip-flops constitute the output signals Q1-Q4 of the read permit/inhibit register 167.

Outputs of the AND gates 161-164 are applied to an OR gate 165. The OR gate 165 outputs an address non-overlap detection signal P. The address non-overlap detection signal P attains H level when the host system accesses a sub-array that does not overlap the address space of the internal memories thereof. The address non-overlap detection signal P is applied to one input of the OR gate 154. The other input of the OR gate 154 receives the storage device address identification signal d2 from the address decoder 153'. Output of the OR gate 154 is applied to the other input of the AND gate 156.

An operation of the embodiment shown in FIG. 4 will be described next. It is assumed that the sub-arrays MA1 and MA2 of the memory cell array 10 have address regions superposed on the address space of the internal memories of the host system, the other sub-arrays MA3 and MA4 having address regions outside this address space. In this case, read permit/inhibit information "0011" is inputted through the read permit/inhibit information input terminal 168 and set to the read permit/inhibit register 167. Consequently, the output signals Q1 and Q2 of the read permit/inhibit register 167 attain L level and the output signals Q3 and Q4 attain H level.

When, under the assumed condition as above, the address data of a memory cell present in the sub-array MA1 or MA2 is inputted from the host system, the address decoder 153' sets the sub-array address identification signal S1 or S2 to H level, and the other sub-array address identification signals to L level. The H-level sub-array address identification signal is applied to the other inputs of the AND gate 161 or 162. However, outputs of the AND gates 161 and 162 are in L level since the output signals Q1 and Q2 of the read permit/inhibit register 167 are in L level as noted above. Outputs of the AND gates 163 and 164 are also in L level since the output signals Q3 and Q4 of the read permit- /inhibit register 167 are in L level as well. Consequently, all the four signals outputted from the AND gates 161-164 are in L level, resulting in an L-level output of the OR gate 165. Thus, the output of the AND gate 156 attains L level to place the tri-state storage device 16a in high-impedance state. On the other hand, since the sub-array address identification signal S1 or S2 attains H level, the memory address identification signal d1 is output in H level from the OR gate 166. At this time, the output of the AND gate 155 is in H level since an H-level read enable signal is inputted through the A-port data read signal input terminal 18a. As a result, the switch 152 is turned on to apply the output of the sense amplifier 12a to the read storage device 151. Thus, the read storage device 151 stores the data read from the selected memory cell. However, the data stored in the read storage device 151 is not outputted to the host system at this time since the tri-state storage device 16a is in high-impedance state.

Next, the host system transmits the address data of the read storage device 151. In response to this, the address decoder 153' sets the address identification signal d2 to H level, and all of the sub-array address identification signals S1–S4 to L level. Since the subarray address identification signals S1–S4 are all in L level, the OR gate 166 sets its output signal or memory address identification signal d1 to L level. As a result, the output of the AND gate 155 attains L level to turn off the switch 152. This inhibits application to the read storage device 151 of the output of the sense amplifier 12a. On the other hand, the OR gate 154 receives the storage device address identification signal d2 at H level and outputs an H-level signal. The AND gate 156 outputs an H-level signal at this time since the read enable signal is inputted through the A-port read signal input terminal 18a. Consequently, the tri-state storage device 16a is placed in through state whereby the data stored in the read storage device 151 passes through the tri-state storage device 16a to be outputted from the A-port data input/output terminal 14a to the host system.

As described above, when access is made to a memory cell having an address overlapping the address space of the internal memories of the host system, data transfer from the read storage device 151 to the host system is inhibited until completion of a cycle of transfer from the memory cell to the read storage device 151. This prevents a collision between the data read from an internal memory of the host system and the data read from a selected memory cell in the memory cell array 10.

An operation will be described next in which data is read from a memory cell belonging to one of the sub-arrays MA3 and MA4 which do not overlap the address space of the internal memories of the host system. First, the address data of a memory cell belonging to the sub-array MA3 or MA4 is inputted from the host system. The address decoder 153' then sets the sub-array address identification signal S3 or S4 to H level, and the other sub-array address identification signals to L level. As a result, the memory address identification signal d1 is outputted at H level from the OR gate 166. The AND gate 155 receives the H-level address identification signal d1, and outputs an H-level signal which turns on the switch 152. As a result, the data read and outputted from the sense amplifier 12a is applied through the switch 152 to the read storage device 151 to be stored therein. On the other hand, the output of the AND gate 163 or 164 is at H level since the sub-array address identification signal S3 or S4 is at H level. This is because the output signals Q3 and Q4 of the read permit/inhibit register 167 are at H level. Upon receipt of the H-level output signal from the AND gate 163 or 164, the OR gate 165 outputs the address non-overlap detection signal P at H level. This places the output of the OR gate 154 at H level. The H-level output of the OR gate 154 is applied to the tri-state storage device 16a through the AND gate 156. As a result, the tri-state storage device 16a changes to enter through state. Then, the data stored in the read storage device 151 passes through the tri-state storage device 16a to be outputted from the A-port data input/output terminal 14a to the host system. No data collision takes place since data is not read from the internal memories in the host system at this time.

Next, the host system transmits the address data of the read storage device 151. In response to this, the address decoder 153' sets all of the sub-array address identification signals S1–S4 to L level, and the address identification signal d2 to H level. Consequently, the memory address identification signal d1 outputted from the OR gate 166 attains L level. As a result, the output of the AND gate 155 attains L level to turn off the switch 152. Thus, the output signal of the sense amplifier 12a is not transmitted to the read storage device 151. On the other hand, the OR gate 154 receives the storage device address identification signal d2 at H level and outputs an H-level signal. Then the AND gate 156 outputs an H-level signal to place the tri-state storage device 16a in through state. This allows the data stored in the read storage device 151 to passe through the tri-state storage device 16a to be outputted from the A-port data input/output terminal 14a to the host system.

As described above, when data is read from the sub-array MA3 or MA4 arranged outside the address space of the internal memories of the host system, the tri-state storage device 16a is in through state all the time. This is because there is no need to avoid a data collision since no data reading from the internal memories is in progress in the host system.

Where the semiconductor memory device shown in FIG. 4 has a speed performance similar to that of the host system, data reading from the sub-arrays MA3 and MA4 whose addresses do not overlap those of the internal memories of the host system may be carried out within one operating cycle of the host system instead of dividing the data reading into two stages. That is, after outputting address data of a memory cell to the semiconductor memory device shown in FIG. 4, the host system may accept the data stored in the read storage device 151 and outputted from the A-port data input/output terminal 14a just before completion of the same operating cycle. Since, in this case, the semiconductor memory device shown in FIG. 4 is operable at high speed, only a short delay occurs during the access for reading, which may be absorbed into one operating cycle of the host system. However, the data reading from the sub-arrays MA1 and MA2 with addresses overlapping those of the internal memories of the host system must be carried out in two stages to avoid a data collision.

In the embodiment shown in FIG. 1, the control circuit including the read storage device 151, switch 152, address decoder 153, OR gate 154 and AND gates 155 and 156 for making read accesses is provided only on the A-port side. A similar read access control circuit may be provided also on the B-port side. Similarly, the embodiments shown in FIGS. 3 and 4 may also include a read access control circuit on the B-port side.

This invention is applicable not only to dual port memories as shown in FIGS. 1, 3 and 4 but to a multi-port memory having three or more input/output ports and to a single port memory having only one input/output port.

In the described embodiments, different addresses are assigned to the read storage device 151 and memory cell array 10. However, part of the addresses assigned to the memory cell array 10 may be used as the address of the read storage device 151. In this case, data reading from and writing to the memory cells in the memory cell array 10 having addresses overlapping the address of the read storage device 151 are inhibited.

According to this invention, as described above, data read from memory cells are outputted to an external system through a storage device, which enables data transfer from the memory cells to the output port to be carried out in two stages. Consequently, even when the semiconductor memory device is accessed by a high-speed CPU having no ready function, the operating speed performance of the system may be used to the full extent without requiring a reduction in the frequency of the operating clock signal of the system.

Further, according to this invention, where the memory cell array includes address regions overlapping the address space of internal memories of the external system, address data received from the external system is checked to see if the address data shows an address in the overlapping address space. The result of the checking is used to control the data transfer to the storage device. This is effective to avoid a collision between the data read from the memory cells in the memory cell array 10 and the data read from the internal memories of the external system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device accessible by an external system comprising:
   a memory cell array including a plurality of memory cells,
   selecting means for selecting one of said memory cells in said memory cell array based on address data applied from said system,
   storing means having an address assigned exclusively thereto and operable to temporarily store and then output to said system data read from the memory cell selected by said selecting means,
   address identifying means for identifying the address data applied from said system as showing an address of one of said memory cells or the address of said storing means, and
   transmission control means responsive to output of said address identifying means for controlling data transmission to and from said storing means.

2. The semiconductor memory device according to claim 1, wherein said transmission control means includes input control means for inputting the data read from the selected memory cell to said storing means when the address data applied from said system shows the address of said memory cell, and inhibiting data input to said storing device means when the address data applied from said system shows the address of said storing means.

3. The semiconductor memory device according to claim 2, wherein said transmission control means further includes output control means for outputting the data stored in said storing means to said system when the address data applied from said system shows the address of said memory cell or the address of said storing means.

4. The semiconductor memory device according to claim 3, wherein said semiconductor memory device is a multi-port memory having a plurality of input/output ports and accessible by a plurality of systems through said input/output ports.

5. The semiconductor memory device according to claim 4, wherein said storing means, said address identifying means and said transmission control means are provided corresponding to one of said input/output ports.

6. The semiconductor memory device according to claim 4, wherein said storing means, said address identifying means and said transmission control means are provided corresponding to at least two of said input-/output ports.

7. The semiconductor memory device according to claim 1, wherein said transmission control means includes output control means for inhibiting output of the data stored in said storage device means to said system when the address data applied from said system shows the address of said memory cell, and outputting the data stored in said storing means to said system when the address data applied from said system shows the address of said storing means.

8. The semiconductor memory device according to claim 7, wherein said transmission control means further includes input control means for inputting the data read from the selected memory cell to said storing means when the address data applied from said system shows the address of said memory cell, and inhibiting data input to said storing means when the address data applied from said system shows the address of said storing means.

9. The semiconductor memory device according to claim 8, wherein said semiconductor memory device is a multi-port memory having a plurality of input/output ports and accessible by a plurality of systems through said input/output ports.

10. The semiconductor memory device according to claim 9, wherein said storing means, said address identifying means and said transmission control means are provided corresponding to one of said input/output ports.

11. The semiconductor memory device according to claim 9, wherein said storing means, said address identifying means and said transmission control means are provided corresponding to at least two of said input-/output ports.

12. A semiconductor memory device accessible by an external system comprising:
   a memory cell array including a plurality of memory cells and having at least part of an address space thereof overlapping internal memories of said system,
   selecting means for selecting one of said memory cells in said memory cell array based on address data applied from said system, storing means having an address assigned exclusively thereto and operable to temporarily store and then output to said system data read from the memory cell selected by said selecting means, address identifying means for identifying the address data applied from said system as showing an address of one of said memory cells or the address of said storing means, address space detecting means operable when the address data applied from said system shows an address of one of said memory cells, for detecting whether said address lies within said overlapping address space, and transmission control means responsive to outputs of said address identifying means and said address space detecting means for controlling data transmission to and from said storing means.

13. The semiconductor memory device according to claim 12, wherein said transmission control means includes output control means responsive to the outputs of said address identifying means and said address space detecting means for controlling output of the data stored in said storing means to said system.

14. The semiconductor memory device according to claim 13, wherein said output controlling means includes:

means for inhibiting output of the data stored in said storing means to said system when the address data applied from said system shows the address of said memory cell and said address lies in said overlapping address space, and outputting the data stored in said storing means to said system when the address data applied from said system shows the address of said memory cell and said address lies outside said overlapping address space; and means for outputting the data stored in said storing means to said system when the address data applied from said system shows the address of said storing means.

15. The semiconductor memory device according to claim 14, wherein said transmission control means further includes input control means responsive to the output of said address identifying means for controlling input of the data from the selected memory cell to said storing means.

16. The semiconductor memory device according to claim 15, wherein said input control means includes means for inputting the data read from the selected memory cell to said storing means when the address data applied from said system shows the address of said memory cell, and inhibiting data input to said storing means when the address data applied from said system shows the address of said storage device means.

17. The semiconductor memory device according to claim 16, wherein said semiconductor memory device is a multi-port memory having a plurality of input/output ports and accessible by a plurality of systems through said input/output ports.

18. The semiconductor memory device according to claim 17, wherein said storing means, said address identifying means, said address space detecting means and said transmission control means are provided corresponding to one of said input/output ports.

19. The semiconductor memory device according to claim 17, wherein said storing means, said address identifying means, said address space detecting means and said transmission control means are provided corresponding to at least two of said input/output ports.

20. A method of reading data from a semiconductor memory device comprising a memory cell array including a plurality of memory cells, selecting means for selecting one of the memory cells in the memory cell array based on address data applied from an external system, and storing means for temporarily storing and then outputting to the external system data read from the memory cell selected by the selecting means, said method comprising the steps of:

reading the data from the selected memory cell and storing the data in said storing means in a first operating cycle of said system, and reading the data from said storing means in a second operating cycle following said first operating cycle.

* * * * *